United States Patent
Casady et al.

(10) Patent No.: US 8,884,270 B2
(45) Date of Patent: Nov. 11, 2014

(54) VERTICAL JUNCTION FIELD EFFECT TRANSISTORS WITH IMPROVED THERMAL CHARACTERISTICS AND METHODS OF MAKING

(75) Inventors: Janna Casady, Starkville, MS (US); Jeffrey Casady, Starkville, MS (US); Kiran Chatty, Oviedo, FL (US); David Sheridan, Starkville, MS (US); Andrew Ritenour, Colfax, NC (US)

(73) Assignee: Power Integrations, Inc., San Jose, CA (US)

( * ) Notice: Subject to any disclaimer, the term of this patent is extended or adjusted under 35 U.S.C. 154(b) by 48 days.

(21) Appl. No.: 13/436,159

(22) Filed: Mar. 30, 2012

(65) Prior Publication Data

US 2012/0261675 A1 Oct. 18, 2012

Related U.S. Application Data

(60) Provisional application No. 61/476,534, filed on Apr. 18, 2011.

(51) Int. Cl.
| | |
|---|---|
| *H01L 29/06* | (2006.01) |
| *H01L 29/808* | (2006.01) |
| *H01L 29/40* | (2006.01) |
| *H01L 29/66* | (2006.01) |

(52) U.S. Cl.
CPC ......... *H01L 29/8083* (2013.01); *H01L 29/402* (2013.01); *H01L 29/66909* (2013.01)
USPC ............................... 257/20; 257/266; 438/193

(58) Field of Classification Search
USPC ............................... 257/77, 20, 266; 438/193
See application file for complete search history.

(56) References Cited

U.S. PATENT DOCUMENTS

| | | | | |
|---|---|---|---|---|
| 4,825,278 | A * | 4/1989 | Hillenius et al. | 257/630 |
| 6,097,046 | A * | 8/2000 | Plumton | 257/266 |
| 6,818,939 | B1 | 11/2004 | Hadizad | |
| 2003/0020136 | A1 | 1/2003 | Kitabatake et al. | |
| 2007/0298564 | A1* | 12/2007 | Brar et al. | 438/212 |
| 2008/0124853 | A1* | 5/2008 | Cheng et al. | 438/193 |
| 2010/0320476 | A1* | 12/2010 | Cheng et al. | 257/77 |

* cited by examiner

*Primary Examiner* — Mark Tornow

(57) ABSTRACT

Vertical junction field effect transistors (VJFETs) having improved heat dissipation at high current flow while maintaining the desirable specific on-resistance and normalized saturated drain current properties characteristic of devices having small pitch lengths are described. The VJFETs comprise one or more electrically active source regions in electrical contact with the source metal of the device and one or more electrically inactive source regions not in electrical contact with the source metal of the device. The electrically inactive source regions dissipate heat generated by the electrically active source regions during current flow.

27 Claims, 12 Drawing Sheets

VERTICAL JUNCTION FIELD EFFECT TRANSISTORS WITH IMPROVED THERMAL CHARACTERISTICS AND METHODS OF MAKING

CROSS-REFERENCE TO RELATED APPLICATIONS

This application claims the benefit of Provisional U.S. Patent Application Ser. No. 61/476,534, filed Apr. 18, 2011, which is incorporated by reference herein in its entirety.

BACKGROUND

1. Field

This application relates generally to semiconductor devices having improved thermal characteristics and, in particular, to vertical junction field effect transistors (VJFETs) having improved thermal characteristics and method of making the devices.

2. Background of the Technology

Silicon carbide vertical JFETs typically have source fingers defined over an active area. The width of the source mesa and trench separating any two source fingers are chosen to meet specific device targets such as threshold voltage and blocking gain. For improved specific on-resistance (i.e., resistance normalized over area) and normalized saturated drain current (i.e., Idsat normalized over area), the source fingers are placed at the smallest possible pitch wherein pitch is equal to the sum of the width of the source finger ($W_{SF}$) and the width of the trench between the source fingers ($W_T$). Placing the fingers at the smallest possible pitch allows the packing of a large number of source fingers in a given active area or given die size.

In certain applications, however, the close proximity of the source fingers resulting from the small pitch results in poor heat dissipation during large current flow through the VJFET. As a result, the temperature of the device can rise. To enable improved heat dissipation and reduce temperature rise in the device, it is preferred that the source fingers be placed further away from each other (i.e., by increasing the trench width). However, a larger trench width can result in a change in the P+ gate implant profile on the source finger sidewall. This in turn can result in changes in the electrical characteristics such as threshold voltage from desired design targets.

Accordingly, there exists a need for VJFETs having improved heat dissipation at high current flow while maintaining the desirable electrical characteristics of devices having small trench widths.

SUMMARY

A device is provided which comprises:
a substrate layer;
an n-type drift layer on the substrate layer;
an n-type channel layer on the drift layer;
a plurality of raised n-type source regions on the channel layer, wherein the raised n-type source regions have an upper surface and are spaced from one another thereby forming trenches between adjacent raised n-type source regions;
an n-type source layer on the upper surface of the raised n-type source regions, wherein the n-type source layer has a higher dopant concentration than the raised n-type source regions;
implanted p-type gate regions in the trenches between the raised n-type source regions; and
a source contact layer;
wherein the source contact layer is in electrical contact with the n-type source layer on one or more of the plurality of raised n-type source regions to form one or more electrically active source regions and wherein the source contact layer is not in electrical contact with the n-type source layer on one or more of the plurality of raised source regions to form electrically inactive source regions.

A method is also provided which comprises:
selectively etching trenches through an n-type source layer and into an underlying n-type channel layer to form a plurality of raised n-type source regions, wherein the raised n-type source regions have an upper surface, and wherein the n-type channel layer is on an n-type drift layer which is on a substrate;
implanting p-type gate regions in the trenches between the raised n-type source regions;
depositing a trench fill material to fill the trenches and cover the raised n-type source regions;
selectively etching through the trench fill material to expose the upper surface of one or more raised n-type source regions, wherein one or more raised n-type source regions remain covered with the trench fill material after selectively etching; and
depositing source metal on the exposed upper surface of the one or more raised n-type source regions, wherein the source metal is not in electrical contact with the raised n-type source regions covered with the trench fill material.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF THE VARIOUS EMBODIMENTS

As described herein, a layer which is "on" another layer can be directly in contact with the layer or directly in contact with an intervening layer. Accordingly, if a layer A is described as being "on" a layer B one or more additional layers can be between layers A and B.

A device is provided which has one or more deactivated source regions. The deactivated source regions are not electrically connected to the source metal layer of the device. A device of this type is shown in FIG. 1.

Figure 1:
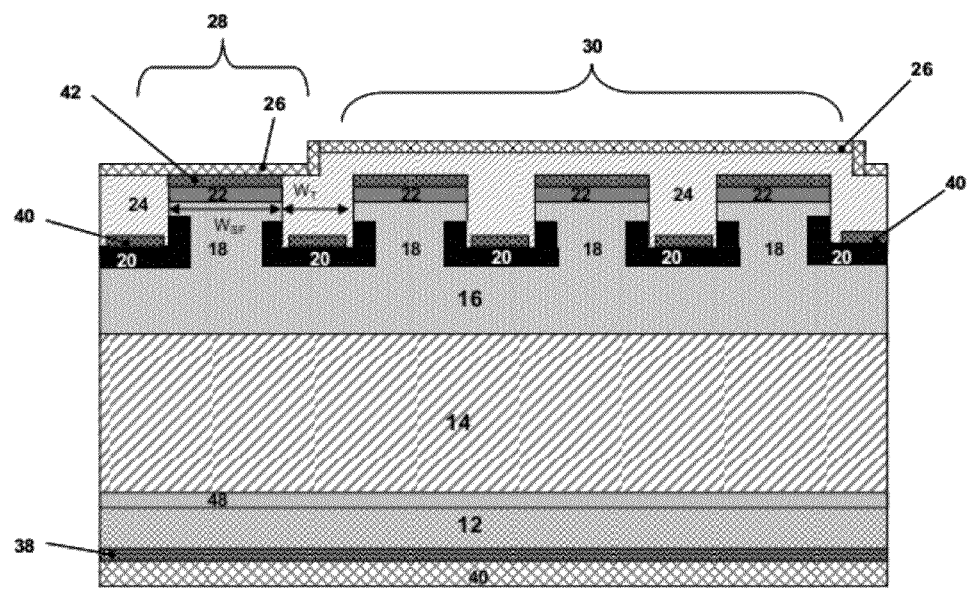
FIG. 1 is a schematic cross-sectional view of a SiC VJFET with four raised source regions wherein one of the source regions is electrically active and can contribute to current conduction and the other three adjacent source regions are electrically inactive and do not conduct current.

FIG. 1 is a schematic cross-sectional view of a SiC VJFET with four source regions wherein one of the source regions is electrically active and can contribute to current conduction and the other three source regions are electrically inactive and do not conduct current. The width of the source finger ($W_{SF}$)

and the width of the trench between the source fingers ($W_T$) is shown in FIG. 1. As set forth above, the pitch of the device is the sum of these values.

As shown in FIG. 1, the device comprises a substrate layer 12, an n-type drift layer 14 on the substrate layer, an n-type channel layer 16 on the drift layer and plurality of raised n-type source regions 18 on the channel layer. Implanted gate regions 20 are shown in the trenches between the raised source regions 18. An n-type source layer 22 is shown on the upper surfaces of the raised source regions 18. Source ohmic contact material 42 is also shown on the n-type source layer 22 on the upper surfaces of the raised source regions 18. As also shown in FIG. 1, a dielectric layer 24 is on the n-type source layer on three of the four source regions. The dielectric layer 24 on these three source regions prevents source contact layer 26 form making electrical contact with the n-type source layer on these three source regions thereby forming inactive source regions 30. As can be seen from FIG. 1, however, source contact layer 26 is in contact with the source ohmic contact material 42 of the electrically active source region 28. The electrically inactive source regions 30 allow cooling of device by helping to dissipate heat from the electrically active source region 28 during current flow.

An optional n-type buffer layer 48 is shown between the substrate layer 12 and the n-type drift layer 14. The n-type buffer layer 48 can be heavily doped. For example, the n-type buffer layer can have a dopant concentration $>1 \times 10^{18}$ cm$^{-3}$.

A drain ohmic contact 38 is also shown on the substrate layer 12 opposite the drift layer 14 and a drain metal contact 40 is shown on drain ohmic contact 38. Gate ohmic contacts 40 are also shown on the implanted gate regions 20. The gate metal contact of the device (not shown) is in electrical communication with gate ohmic contact material 40.

Although one electrically active source region 28 and three electrically inactive source regions 30 are shown in FIG. 1, other configurations can be used. For example, the device can comprise a plurality of electrically active source regions. In addition, any number of electrically inactive source regions can be used for each electrically active source region of the device.

The presence of the electrically inactive source regions facilitates heat dissipation from the electrically active source fingers and can thereby prevent an increase in temperature of the device during a large current flow through the device.

As shown in FIG. 1, the electrical deactivation of one or more source fingers can be implemented by, for example, depositing a layer of dielectric material (e.g., silicon dioxide tetraethyl orthosilicate) over one or more source fingers to prevent the source metal from making electrical connection to the source layer on these source fingers. In this manner, these source fingers are electrically inactive and can help dissipate heat generated by the adjacent active source fingers.

The raised n-type source regions can have a substantially uniform spacing and width. As used herein, "substantially uniform" in the context of the width and spacing of the raised source regions of the device means that the width and spacing of the source regions vary by no more than 5%. Similarly, the dimension (e.g., width) of a device features which is described as being "substantially the same" as that of another feature will vary by no more than 5% from that of the other feature.

The electrically inactive fingers in the device described above can contribute gate to drain capacitance. Moreover, even though the source regions of the device are electrically inactive, these inactive source regions can contribute to the parasitic gate junction to drain junction capacitance. The parasitic capacitance can limit the transient response of the VJFET.

Figure 2:
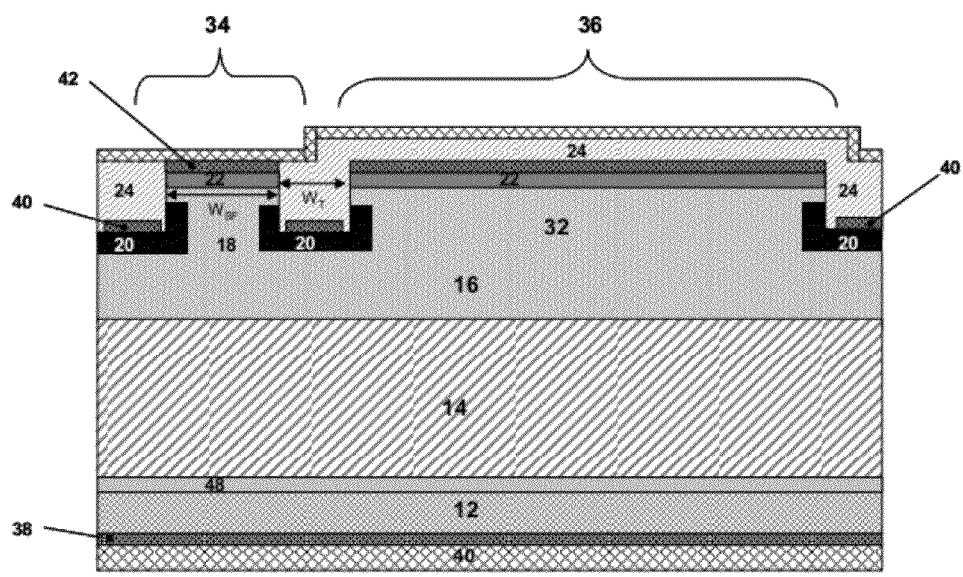
FIG. 2 is a schematic cross-sectional view of a SiC VJFET device having an electrically active source region and an adjacent electrically inactive source mesa.

The parasitic capacitance can be reduced by in effect merging the inactive fingers of the device described above so that there is no p+ gate implant between inactive fingers. A schematic of a device of this type is shown in FIG. 2. FIG. 2 is a schematic cross-sectional view of a SiC VJFET device having one electrically active source region and an adjacent electrically inactive source region (i.e., source mesa) having a greater width than the electrically active source region.

As shown in FIG. 2, the device comprises a substrate layer 12, an n-type drift layer 14 on the substrate layer, an n-type channel layer 16 on the drift layer and a raised n-type source region 18 on the channel layer. The device also comprises a raised n-type source region 32 on the channel layer 16 and spaced from the raised n-type source region 18 thereby forming a trench. As shown in FIG. 2, the raised n-type source region 32 is wider than the raised n-type source region 18. Implanted gate regions 20 are shown in the trench between the raised source regions 18 and 32. An n-type source layer 22 is shown on the upper surfaces of the raised source region 18 and the raised source region 32. As also shown in FIG. 2, source ohmic contacts 42 are on the n-type source layer 22 on the upper surfaces of the raised source region 18 and the raised source region 32. As shown in FIG. 2, a dielectric layer 24 is formed on the source layer 22 on the raised n-type source region 32. A source contact layer 26 is formed in electrical communication with the source ohmic contact material 42 of the raised source region 18. As also shown in FIG. 2, however, dielectric layer 22 prevents source contact layer 26 from making electrical contact with the source layer 22 on the raised source region 32. The raised source region 32 thereby forms the electrically inactive portion of the device 36. The raised source region 18 which is in contact with the source contact layer 26 forms the electrically active portion of the device 34.

In FIG. 2, an optional n-type buffer layer 48 is shown between the substrate layer 12 and the n-type drift layer 14. The n-type buffer layer 48 can be heavily doped. For example, the n-type buffer layer can have a dopant concentration $>1 \times 10^{18}$ cm$^{-3}$.

In FIG. 2, drain ohmic contact 38 is also shown on the substrate layer 12 opposite the drift layer 14 and a drain metal contact 40 is shown on drain ohmic contact 38. Gate ohmic contacts 40 are also shown on the implanted gate regions 20. The gate metal contact of the device (not shown) is in electrical communication with the gate ohmic contact material 40.

As can be seen from FIG. 2, the electrically inactive source region 32 is wider than the adjacent electrically active source region 18. According to some embodiments, the width of the source region 32 is a multiple of the width of the source finger. For example, the source region 32 can be 2 times or 3 times the width of the source region 18.

As can be seen from FIG. 2, the source region 32 does not have trenches or gate regions. Accordingly, there are no implanted gate regions in the inactive portion of the device shown in FIG. 2. The absence of gate regions in the inactive portion of the device can allow for a reduction in gate to drain capacitance of the device while maintaining the improved thermal characteristics of the device.

Figure 3:
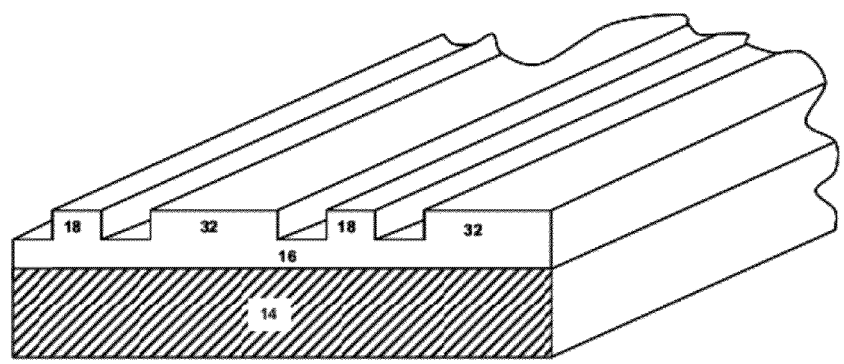
FIG. 3 is a schematic perspective view of a SiC VJFET device having an electrically active source region and an adjacent electrically inactive source mesa.

FIG. 3 is a schematic perspective view of a SiC VJFET device having a plurality (two shown) of electrically active source regions 18 and a plurality (two shown) of electrically inactive source regions 32.

Figure 4A:
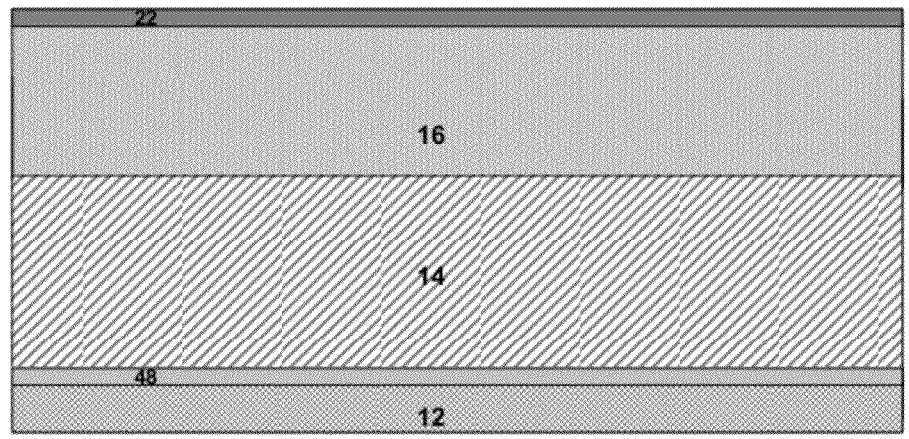
FIGS. 4A-4S illustrate a method of making a VJFET device having electrically inactive source regions.
Figure 4B:
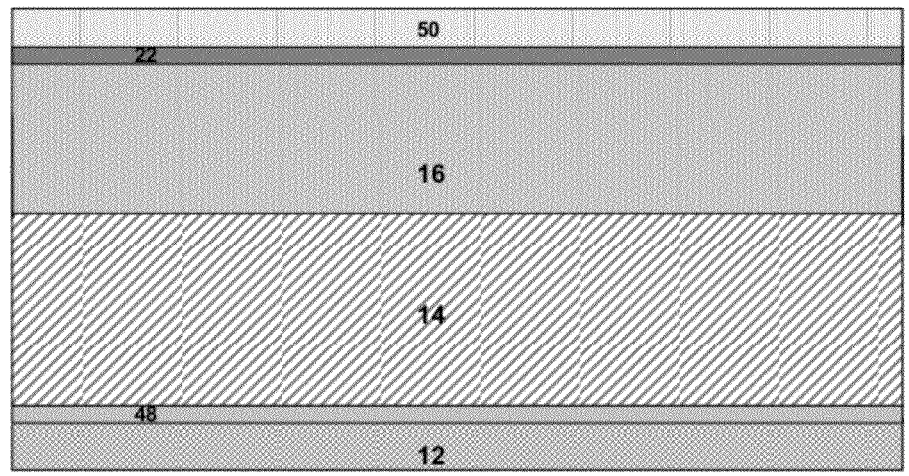
Figure 4C:
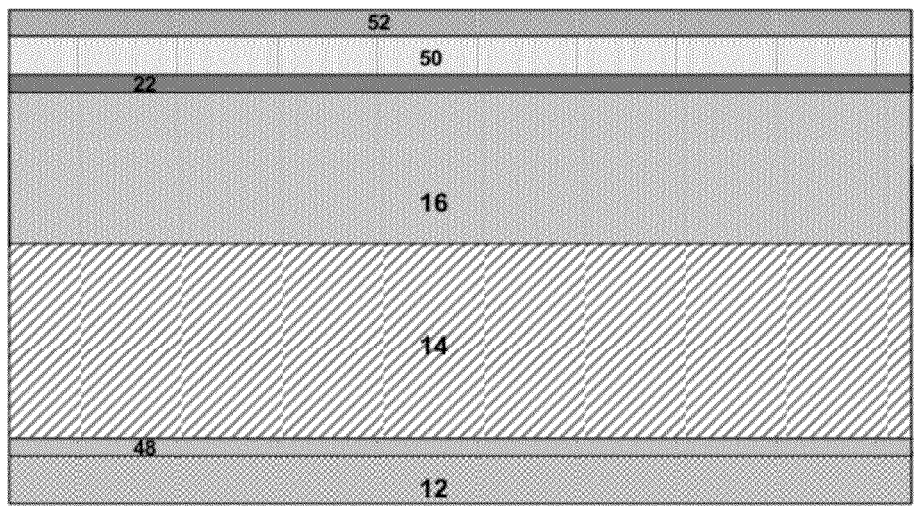
Figure 4D:
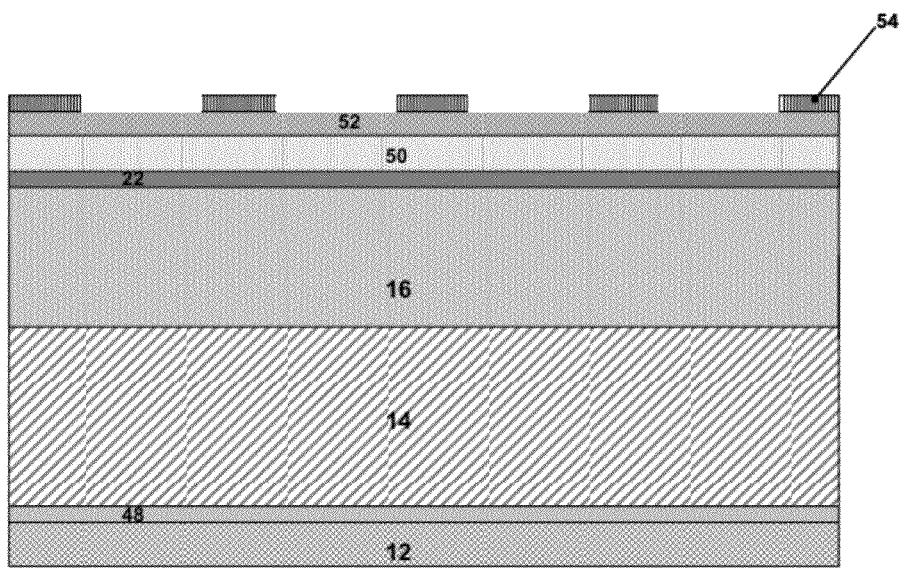
Figure 4E:
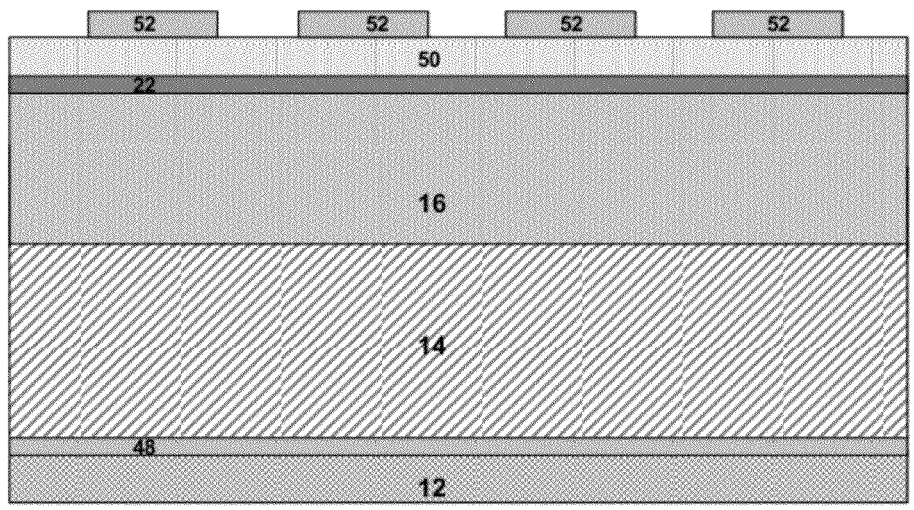
Figure 4F:
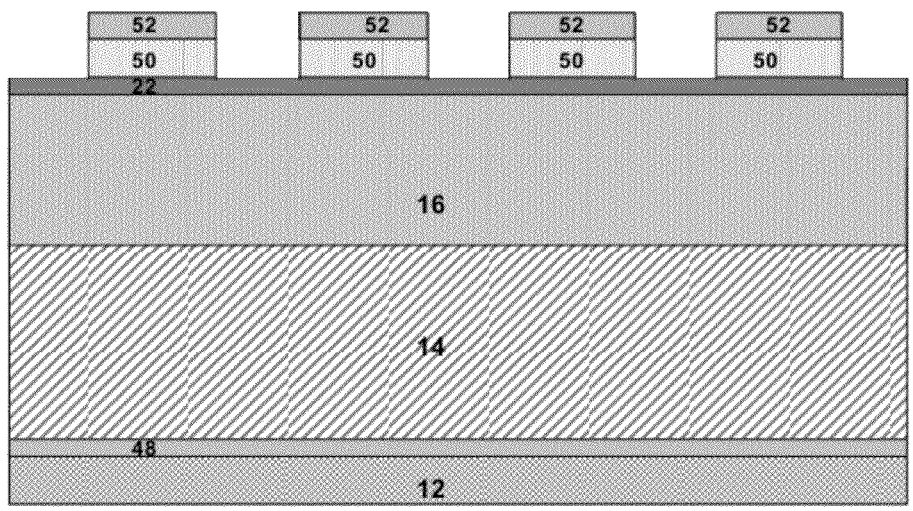
Figure 4G:
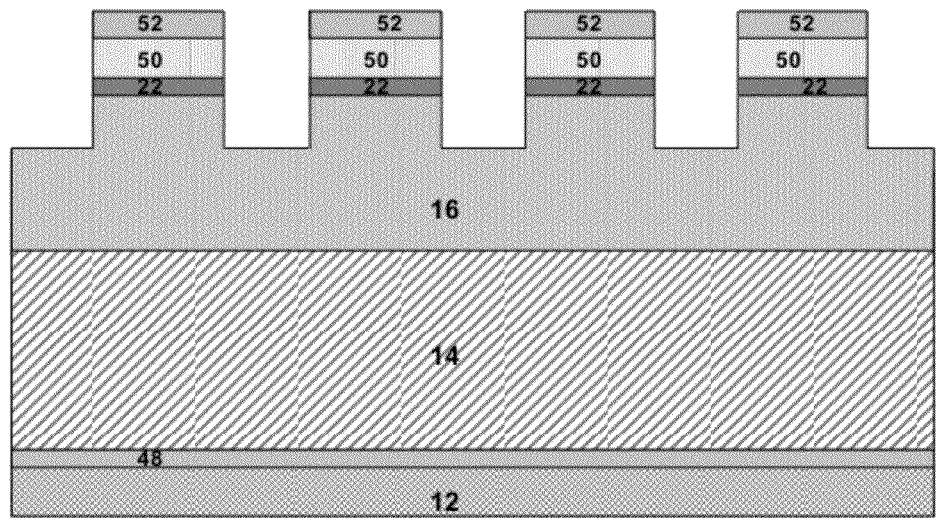
Figure 4H:
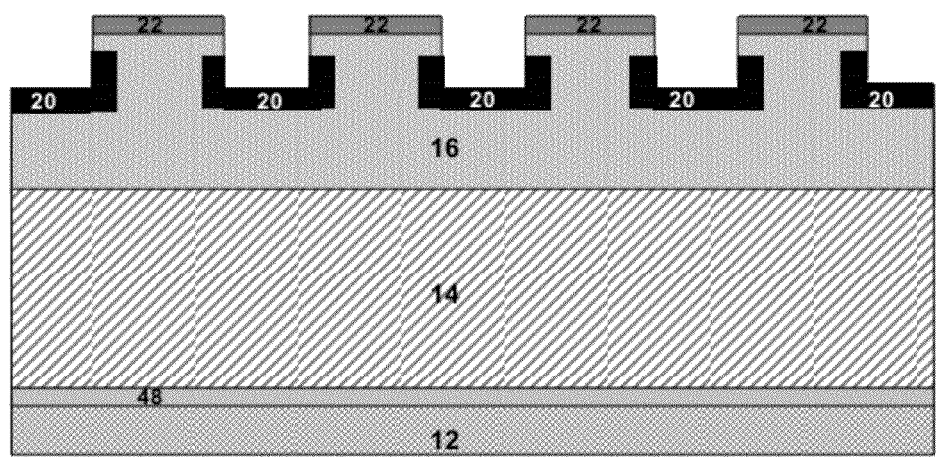
Figure 4I:
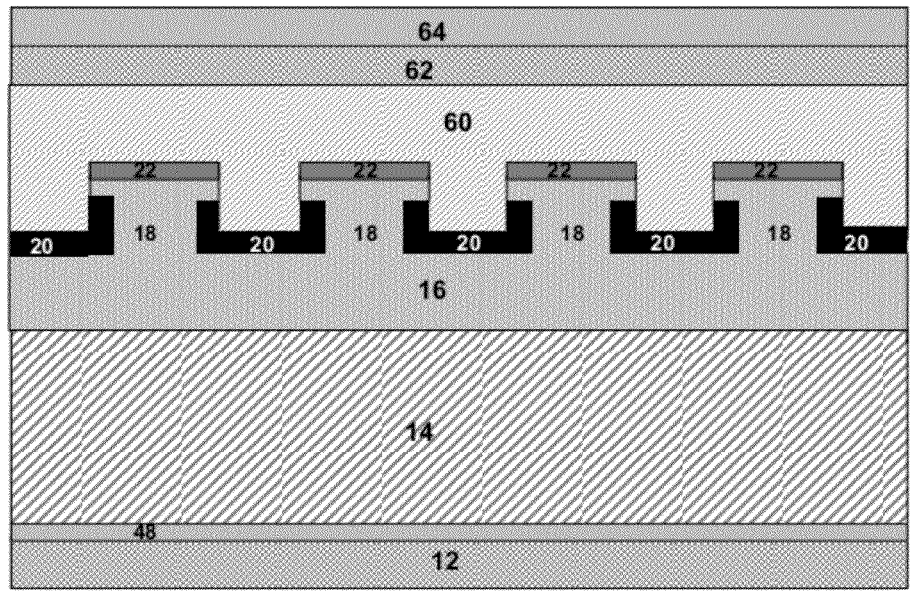
Figure 4J:
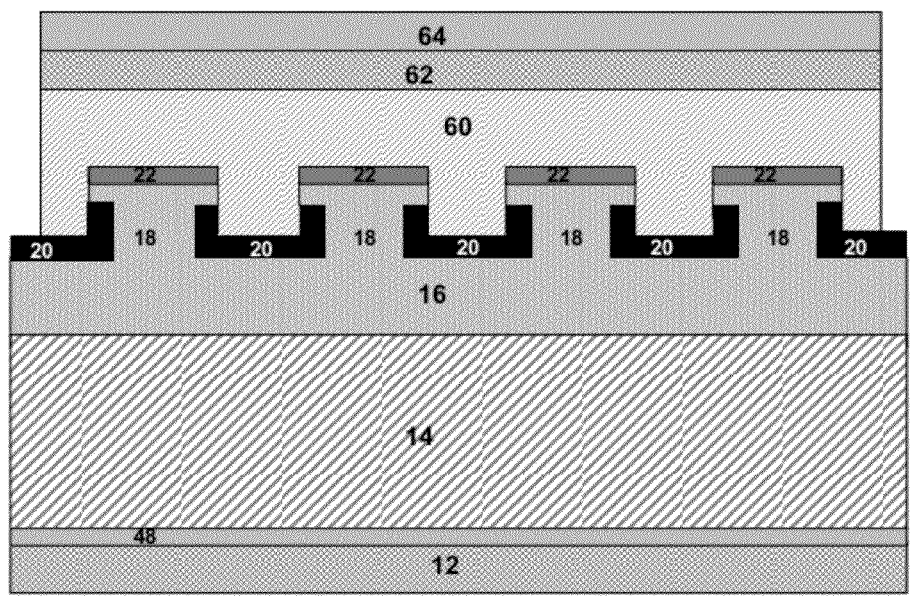
Figure 4K:
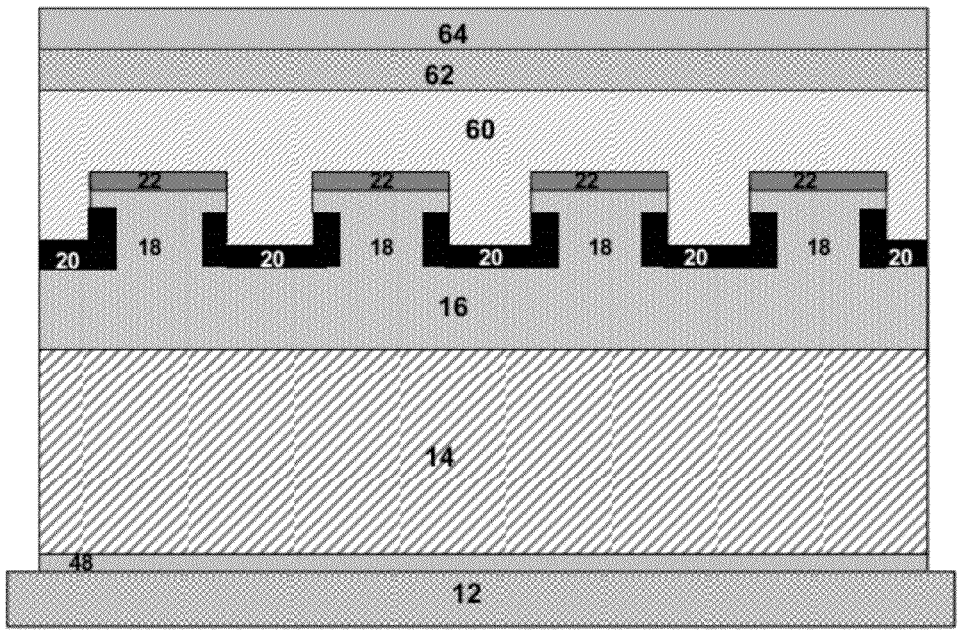
Figure 4L:
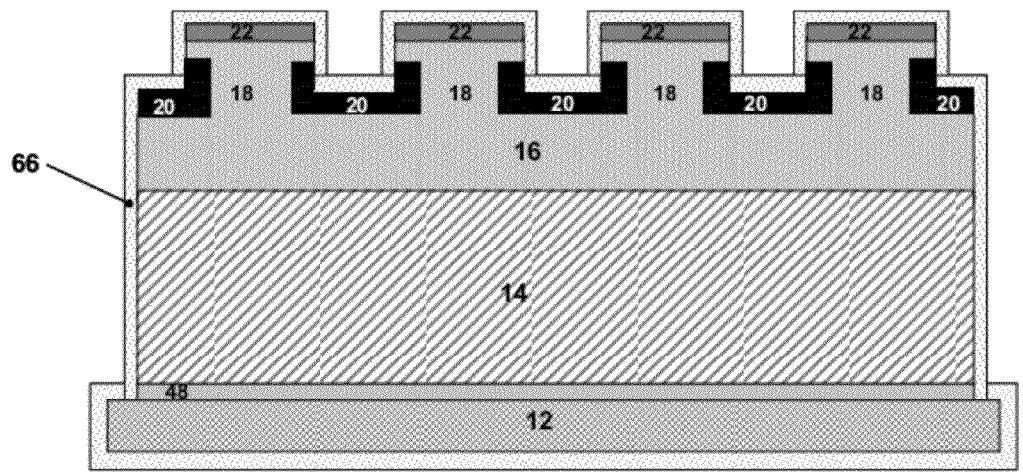
Figure 4M:
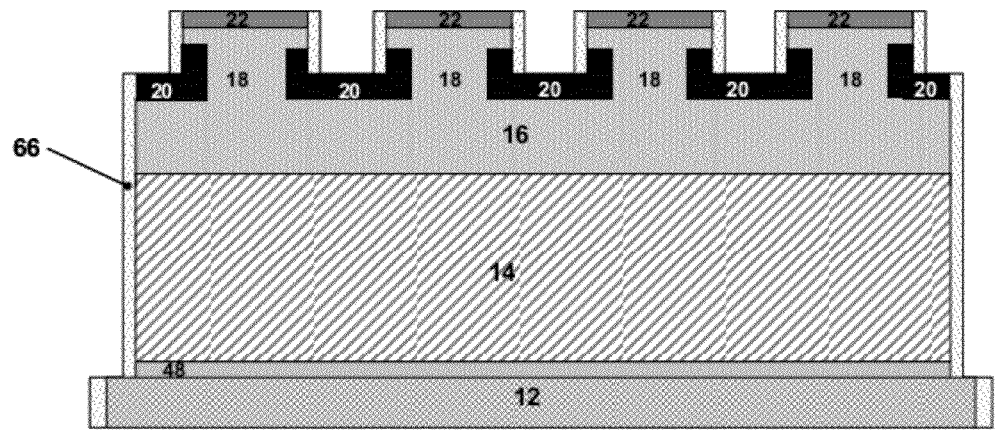
Figure 4N:
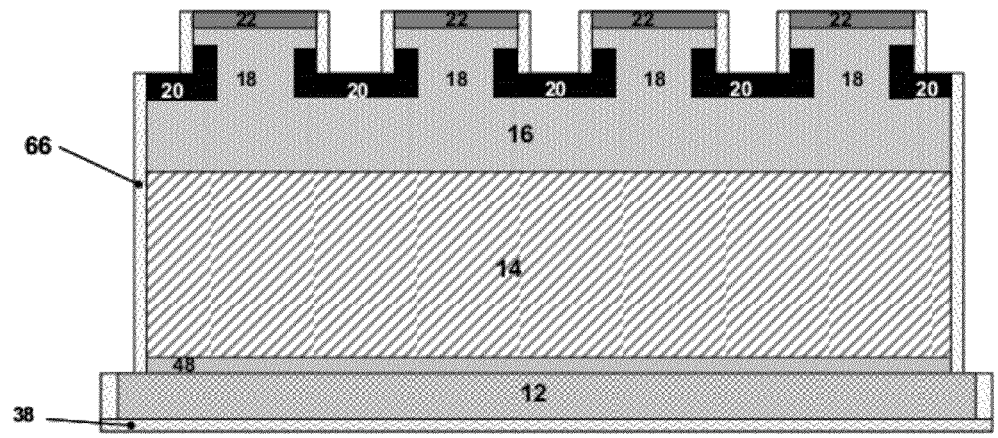
Figure 4O:
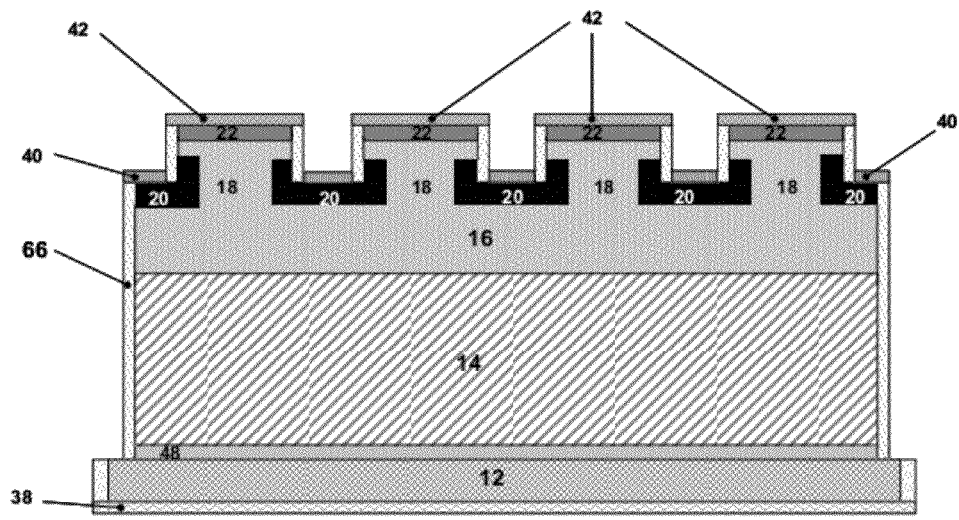
Figure 4P:
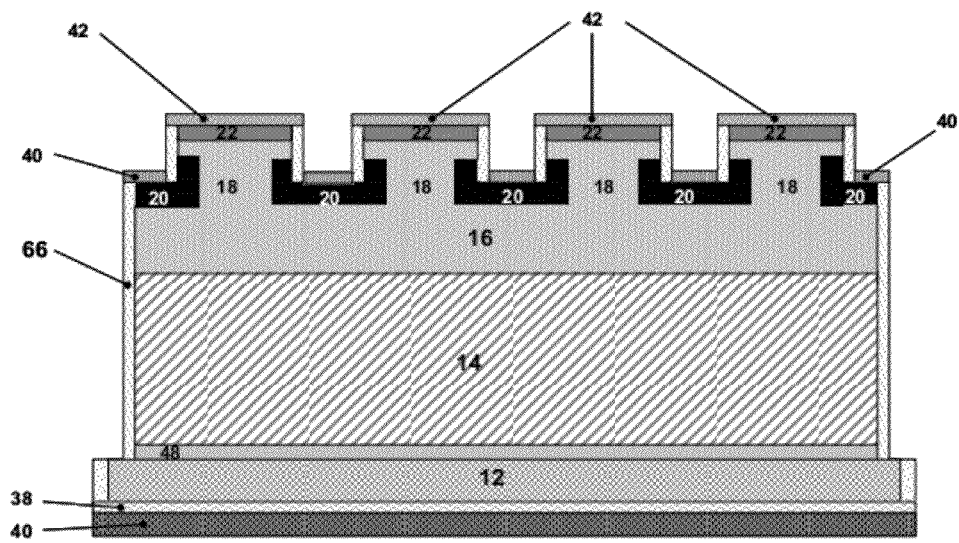
Figure 4Q:
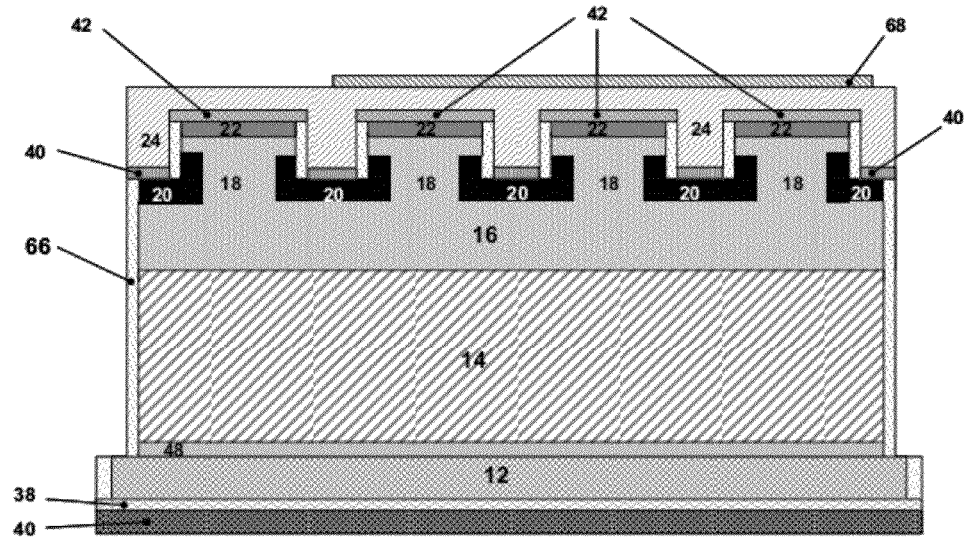
Figure 4R:
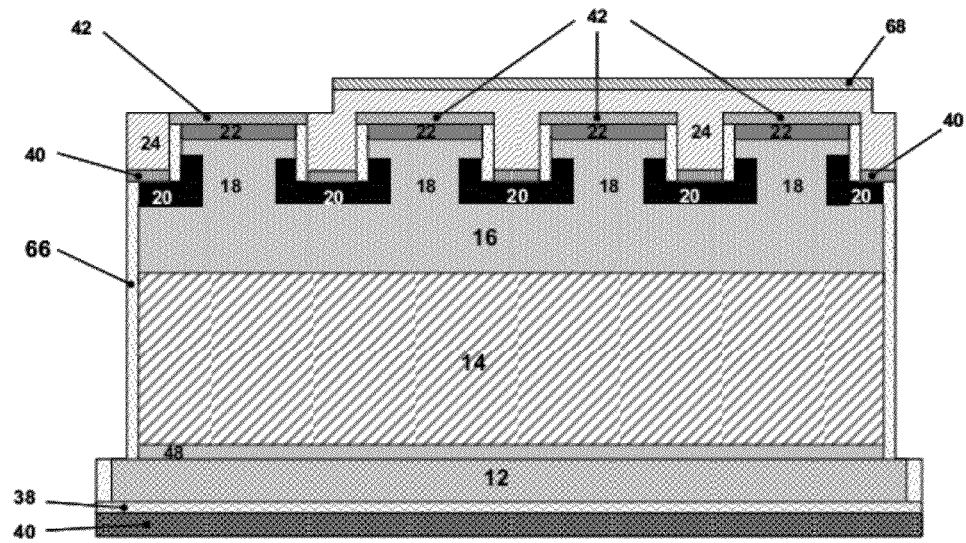
Figure 4S:
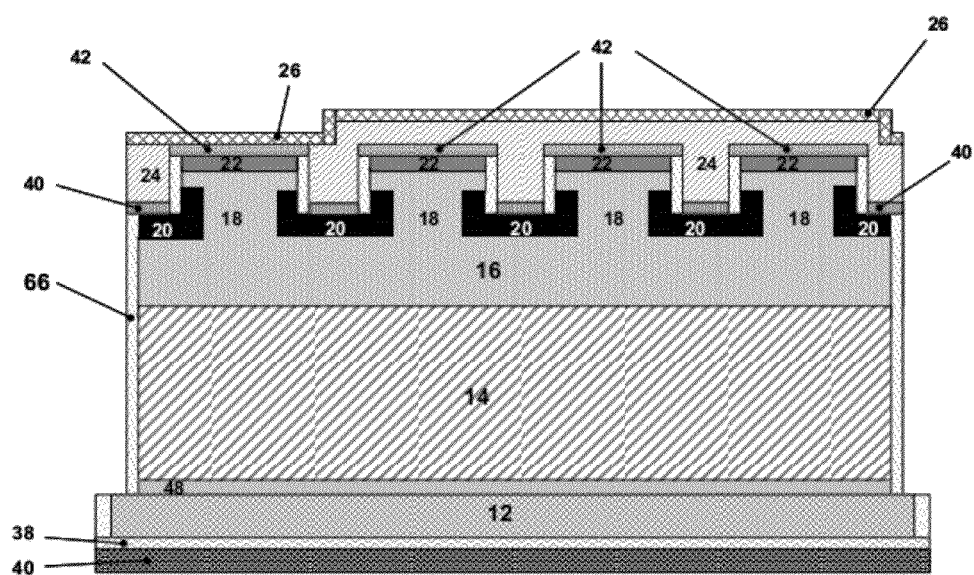

FIGS. 4A-4S illustrate a method of making a VJFET device as described herein. As shown in FIGS. 4A and 4B, an oxide layer 50 is deposited on a n-type source layer 22 which is on an n-type channel layer 16 which is on an n-type drift layer 14 which is on a n-type buffer layer 48 which is on a substrate 12. As shown in FIG. 4C, a photoresist 52 is coated on oxide layer 50. Photoresist 52 is then patterned using metal mask 54 as shown in FIGS. 4D and 4E. The mask 54 can be a metal mask such as a nickel mask. Oxide layer 50 is then selectively etched as shown in FIG. 4F. Subsequently, n-type source layer 22 and channel layer 16 are selectively etched as shown in FIG. 4G. Oxide layer 50 and photoresist 52 are then removed and implanted gate regions 20 are formed in the trenches in the channel layer 16 as shown in FIG. 4H.

As shown in FIG. 4I, a photoresist material 60 is then applied to cover the etched features. A layer of metal 62 (e.g., nickel) and an additional layer of photoresist material 64 are then deposited on photoresist material 60. Photoresist material 64 is then masked and developed and the underlying metal layer 62 and photoresist material 60 are etched as shown in FIG. 4J. Subsequently, underlying channel layer 16, drift layer 14 and buffer layer 48 are etched to form a mesa termination for the device as shown in FIG. 4K.

As shown in FIG. 4L, a passivation layer 66 can then be grown on exposed surfaces of the device. The passivation layer 66 can be an oxide. Passivation layer 66 is then anisotropically etched as shown in FIG. 4M to expose source layer 22 and implanted gate regions 20 while leaving passivation layer 66 on the sidewalls of the trenches and the mesa edge termination. A drain ohmic contact 38 can then be formed on the substrate opposite the drift layer as shown in FIG. 4N. As shown in FIG. 4O, gate ohmic contacts 40 can also be formed on the implanted gate regions 20 and source ohmic contacts 42 can be formed on the source layer 22. The gate, source and drain ohmic contact material can be formed by depositing an ohmic contact material (e.g., nickel) on the SiC and annealing to form the gate, source and drain ohmic contacts. Drain metal layer 40 can then be deposited on the drain ohmic contact 38 as shown in FIG. 4P.

As shown in FIG. 4Q, oxide 24 is deposited to fill the trenches and cover the source layer 42. After oxide deposition, a blanket etchback (not shown) on the entire wafer can be performed to reduce some of the overall film thickness on the top of the source fingers. This step can be followed by a patterned etchback (not shown) of the full device source area until a desired thickness of oxide film (e.g., ~1 μm) is left over all of the source fingers.

As shown in FIG. 4R, mask 68 is then placed on the oxide 24 over some (three shown) of the raised source regions 18. Oxide 24 is then selectively etched using mask 68 to expose the source ohmic contact 42 of the remaining (one shown) raised source regions 18. Mask 68 is then removed and source metal 26 is deposited as shown in FIG. 4S.

Although not shown, oxide 24 can also be patterned to expose implanted gate regions 20 for deposition of the gate metal contact of the device.

It should be noted that the trench width between the electrically inactive source region and the adjacent electrically active source region can be kept uniform and small. Accordingly, the correct P+ junction profile can be achieved via sidewall scattering which in turn ensures the desired electrical characteristics of the VJFET device such as threshold voltage.

The raised source regions can be elongate regions having a major dimension and a minor dimension. The elongate raised n-type source regions can be spaced from one another along the minor dimension and oriented such that the major dimensions are parallel to one another (e.g., the source regions can be arranged as fingers as shown in FIG. 3).

The semiconductor devices described herein can be made in a wide band gap semiconductor material. The wide band gap semiconductor material can be a semiconductor material having a band-gap energy $E_G$>2 eV.

The wide band gap semiconductor material used for the devices described herein can be SiC. The SiC can be the 4H polytype of SiC. Other polytypes of SiC (e.g., 6H—SiC, 3C—SiC or 15R—SiC) or other wide bandgap semiconductor materials such as Group III nitride compound semiconductors (e.g., gallium nitride GaN), however, can also be used.

The layers of the device can be formed by doping the layers with donor or acceptor materials using known techniques. Exemplary donor materials for SiC include nitrogen and phosphorus. Exemplary acceptor materials for doping SiC include boron and aluminum. The above materials are merely exemplary, however, and any acceptor and donor materials which can be doped into silicon carbide can be used.

The doping levels and thicknesses of the various layers of the devices described herein can be varied to produce a device having desired characteristics for a particular application. Similarly, the dimensions of the various features of the device can also be varied to produce a device having desired characteristics for a particular application.

The SiC layers can be formed by epitaxial growth on a suitable substrate. The layers can be doped during epitaxial growth.

The thickness of the substrate can be 225-375 μm (e.g., 350 μm). The thickness of the drift layer can be 5 μm-100 μm. The thickness of the channel layer can be 1 μm-10 μm. The thicknesses provided above are merely exemplary, however, and can be varied depending on application needs.

The substrate can be an N-type substrate. The N-substrate substrate can have a dopant concentration >$1 \times 10^{18}$ cm$^{-3}$. A semi-insulating substrate can also be used.

The dopant concentration of the drift layer can be $1 \times 10^{15}$ cm$^{-3}$ to $1 \times 10^{16}$ cm$^{-3}$ and can be varied depending on application needs. The dopant concentration of the channel layer and source regions can be $1 \times 10^{16}$-$1 \times 10^{17}$ cm$^{-3}$ and can also be varied depending on application needs. The dopant concentrations provided above are merely exemplary, however, and can be varied depending on application needs.

The width of source regions can be 0.8 μm to 1.5 μm. The width of the trenches between adjacent raised source regions can be 1 μm to 3 μm. The widths provided above are merely exemplary, however, and can be varied depending on application needs.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A field-effect transistor comprising:
   a substrate layer;
   an n-type drift layer on the substrate layer;
   an n-type channel layer on the drift layer;
   a plurality of raised regions on the channel layer, wherein the raised regions have an upper surface and are spaced from one another and define a trench between adjacent raised regions;
   an n-type source layer on the upper surface of the raised regions, wherein the n-type source layer has a higher dopant concentration than the raised regions;

implanted p-type gate regions in the trenches between the raised regions; and a source contact layer extending over the plurality of raised regions;

wherein the source contact layer is in electrical contact with the n-type source layer on one or more of the plurality of raised regions to form one or more electrically active source regions and wherein the source contact layer is not in electrical contact with the n-type source layer on one or more of the plurality of raised regions to form electrically inactive source regions.

2. The field-effect transistor of claim 1, wherein the width of the trenches between adjacent raised regions is substantially uniform.

3. The field-effect transistor of claim 1, wherein the raised regions have a substantially uniform width.

4. The field-effect transistor of claim 1, wherein the electrically active source regions have a first width and the electrically inactive source regions have a second width greater than the first width.

5. The field-effect transistor of claim 1, further comprising an electrically insulating layer on the n-type source layer on the one or more electrically inactive source regions, wherein the source contact layer is on the electrically insulating layer.

6. The field-effect transistor of claim 5, wherein the electrically insulating layer is SiO2 or tetraethyl orthosilicate (TEOS).

7. The field-effect transistor of claim 1, comprising at least two electrically active source regions.

8. The field-effect transistor of claim 1, wherein the raised regions are elongate regions having a major dimension and a minor dimension, wherein the raised regions are spaced from one another along the minor dimension and are oriented such that the major dimensions are parallel to one another.

9. The field-effect transistor of claim 1, wherein the trenches have a width of 1 to 3 µm.

10. The field-effect transistor of claim 1, wherein at least one electrically inactive source region is adjacent each of the electrically active source regions.

11. The field-effect transistor of claim 10, wherein the field-effect transistor comprises three electrically inactive source regions adjacent each electrically active source region.

12. The field-effect transistor of claim 1, wherein the substrate is an n-type substrate or a semi-insulating substrate.

13. The field-effect transistor of claim 1, wherein the substrate has a thickness of 225-375 µm and/or a doping concentration greater than $1\times10^{18}$ cm$^{-3}$.

14. The field-effect transistor of claim 1, wherein the drift layer has a thickness of 5-100 µm and/or a dopant concentration of $1\times10^{15}$-$1\times10^{16}$ cm$^{-3}$.

15. The field-effect transistor of claim 1, wherein the channel layer has a thickness of 1-10 µm and/or a dopant concentration of $1\times10^{16}$-$1\times10^{17}$ cm$^{-3}$.

16. The field-effect transistor of claim 1, wherein the raised regions have a width of 0.8-1.5 µm.

17. The field-effect transistor of claim 1, wherein the field-effect transistor is a wide-bandgap semiconductor field-effect transistor.

18. The field-effect transistor of claim 1, wherein the field-effect transistor is a SiC semiconductor field-effect transistor.

19. The field-effect transistor of claim 1, further comprising a gate contact layer in electrical contact with the implanted p-type gate regions.

20. The field-effect transistor of claim 1, further comprising a drain contact layer on the substrate opposite the drift layer.

21. The field-effect transistor of claim 1, further comprising ohmic contacts on the raised regions, wherein the source contact layer is on the ohmic contact on the raised regions of the one or more electrically active source regions.

22. The field-effect transistor of claim 1, further comprising ohmic contacts on the implanted gate regions and on the substrate opposite the drift layer.

23. The field-effect transistor of claim 1, further comprising an n-type buffer layer between the substrate layer and the drift layer.

24. A method for making a field-effect transistor comprising
a substrate layer,
an n-type drift layer on the substrate layer,
an n-type channel layer on the drift layer,
a plurality of raised regions on the channel layer, wherein the raised regions have an upper surface and are spaced from one another and define-a trench between adjacent raised regions;
an n-type source layer on the upper surface of the raised regions, wherein the n-type source layer has a higher dopant concentration than the raised regions,
implanted p-type gate regions in the trenches between the raised regions, and
a source contact layer extending over the plurality of raised regions,
wherein the source contact layer is in electrical contact with the n-type source layer on one or more of the plurality of raised regions to form one or more electrically active source regions and wherein the source contact layer is not in electrical contact with the n-type source layer on one or more of the plurality of raised regions to form electrically inactive source regions, the method comprising:
selectively etching trenches through an n-type source layer and into an underlying n-type channel layer to form a plurality of raised regions, wherein the raised regions have an upper surface, and wherein the n-type channel layer is on an n-type drift layer which is on a substrate;
implanting p-type gate regions in the trenches between the raised regions;
depositing a trench fill material to fill the trenches and cover the raised regions;
selectively etching through the trench fill material to expose the upper surface of one or more raised regions, wherein one or more raised regions remain covered with the trench fill material after selectively etching; and
depositing source metal on the exposed upper surface of the one or more raised regions and the raised regions covered with the trench fill material, wherein the source metal is not in electrical contact with the raised regions covered with the trench fill material.

25. The method of claim 24, further comprising:
forming source ohmic contacts on the n-type source layer of the raised regions before depositing the trench fill material;
wherein selectively etching through the trench fill material exposes the source ohmic contacts of one or more raised regions and wherein the source metal is deposited on the source ohmic contacts.

26. The method of claim 24, wherein the trench fill material is an oxide.

27. The method of claim 24, wherein the raised regions in electrical contact with the source metal have substantially the same width as the raised regions not in electrical contact with the source metal.

* * * * *